United States Patent [19]
Muranaka et al.

[11] Patent Number: 5,192,393
[45] Date of Patent: Mar. 9, 1993

[54] METHOD FOR GROWING THIN FILM BY BEAM DEPOSITION AND APPARATUS FOR PRACTICING THE SAME

[75] Inventors: Yasushi Muranaka, Katsuta; Hisao Yamashita, Hitachi; Akira Kato, Hitachi; Hiroshi Miyadera, Hitachi, all of Japan

[73] Assignee: Hitachi, Ltd., Tokyo, Japan

[21] Appl. No.: 524,980

[22] Filed: May 18, 1990

[30] Foreign Application Priority Data

May 24, 1989 [JP] Japan ................................. 1-128850

[51] Int. Cl.$^5$ ............................................ C30B 23/08
[52] U.S. Cl. .................................... 156/610; 156/613; 156/DIG. 64; 437/106; 264/157.44; 264/192.25
[58] Field of Search ............... 156/610, 613, DIG. 64; 437/106; 204/157.44, 152.44, 192.25

[56] References Cited

U.S. PATENT DOCUMENTS

| | | | |
|---|---|---|---|
| 3,847,115 | 11/1974 | Tashbor | 118/49.1 |
| 4,227,961 | 10/1980 | Takagi | 156/DIG. 64 |
| 4,351,856 | 9/1982 | Matsui et al. | 437/106 |
| 4,443,488 | 4/1984 | Little et al. | 437/106 |
| 4,483,725 | 11/1984 | Chang | 204/192.25 |
| 4,508,609 | 4/1985 | Moustakas et al. | 204/192.25 |
| 4,572,842 | 2/1986 | Dietrich et al. | 204/192.25 |

FOREIGN PATENT DOCUMENTS

| | | |
|---|---|---|
| 56-028500 | 3/1981 | Japan . |
| 57-171660 | 10/1982 | Japan ................................. 156/613 |
| 56-19660 | 11/1984 | Japan . |
| 61-32415 | 2/1986 | Japan ................................. 156/613 |
| 61-238965 | 10/1986 | Japan . |
| 62-60872 | 3/1987 | Japan . |
| 62-238364 | 10/1987 | Japan . |

OTHER PUBLICATIONS

Ben Shaul et al, *Lasers and Chemical Change*, Springes-Verlag New York, 1981, pp. 42-43.

Primary Examiner—Robert Kunemund
Attorney, Agent, or Firm—Antonelli, Terry, Stout & Kraus

[57] ABSTRACT

A method for growing a thin film on a substrate of metal or ceramics by beam deposition comprising the steps of:

(I) producing from starting gases ions of elements or compounds thereof to be deposited on the substrate;

(II) irradiating the ions produced in step (I) with electromagneti waves to electronically excite at least one sort of said ions; and (III) impacting an ion beam comprising the ions excited in step (II) onto said substrate to deposit thereon, thereby growing a film, and an apparatus for practicing the method. The method enables the formation of thin films having a higher crystallinity by electronically exciting ions or neutral species to increase the internal energy thereof and then impacting a beam comprising the excited ions or neutral species onto the substrate.

22 Claims, 3 Drawing Sheets

METHOD FOR GROWING THIN FILM BY BEAM DEPOSITION AND APPARATUS FOR PRACTICING THE SAME

The present invention relates to a method for growing a thin film having a thickness on the order of micron or submicron on a substrate by beam deposition, and an apparatus for practicing the method. The method of the present invention is particularly suitable for production of semiconductor devices for use in computers and related systems, or catalysts in the form of a thin film.

There have been prior techniques for growing a thin film having a thickness on the order of micron or submicron on a substrate of metal or ceramics as explained hereunder..

One of the most conventional techniques which have been put into practice is a chemical vapor deposition method (referred to as CVD method). In principle, it is to form a thin film by decomposing starting gases through a thermal reaction and depositing the decomposition products in the form of a thin film on a substrate. There are some typical methods differently named depending upon means for decomposing starting gases such as thermal CVD using heating, and plasma CVD using plasma generated with microwaves or high frequency electromagnetic waves. Although these methods have been partly practiced, they involve some serious problems.

For example, the thermal CVD method can form a thin film on a substrate by decomposing starting gases with the thermal energy from the substrate generally heated at a high temperature of 1000° C. or more to produce neutral particles, and depositing the decomposed species on the substrate. The deposition of the neutral species with low internal energy onto the substrate leads to poor crystallinity. Moreover, the heating at high temperatures may result in deterioration of the substrate; an increase in the number of defects in crystals obtained, deformation of the substrate; redistribution of impurities during film growth; separation of a films due to a difference in thermal expansion coefficient between the substrate and the film; and the like. These drawbacks lead to deterioration of semiconductor devices in the semiconductor art, resulting in an reduction of the performance of the devices. With reference to thin film catalysts, they may cause deactivation thereof.

The plasma CVD method can easily decompose the starting gases with plasma, and has an advantage of lowering the temperature of a substrate to several hundred degrees centigrade or so. Highly reactive ions and radicals having higher internal energy present in the plasma activate a reaction on the growing surface. In such a technique, however, charged particles or high energy (20 to $10^3$ eV) rays such as ions, electrons, or ultraviolet radiation incident to the substrate from the plasma during thin film growth may cause surface damages and intrusion of defects into crystals, making it difficult in effect to form films having a high crystallinity, as described in the literature, J. Appl. Phys., Vol. 57, No. 11, pp. 1721-1727 (1988).

Alternatively, there is an ion beam method for growing thin films using active ions selected from those present in the plasma. This method can deposit thin films on a substrate by impacting accelerated ion beam onto the substrate in a high vacuum. Since the internal energy and the kinetic energy of the ions are very large, it has been expected that the use of such energies for the activation energy for crystallization allows easy growth of crystalline thin films. As disclosed in the literature, J. Appl. Phys., 43, 794 (1972), it has been confirmed that the method allows the crystallization temperature to be lowered by 200° C. to 300° C. than is usually encountered. However, the resulting films contain defects because this method grows films accompanying with faults of the surface crystallinity.

Alternatively, there is a light CVD method which uses light rays such as laser or ultraviolet radiation to generate active radicals. In this method, the substrate temperature can be lowered because the starting gases can be decomposed with the light rays. Moreover, the method has advantages that the formation of active radicals during the decomposition promotes the reaction on the growing surface. However, it has practically detrimental drawback that a low-quality film is deposited on a light inlet window disposed for introducing ultraviolet rays into a film growing chamber, resulting in prevention of the ultraviolet rays from transmitting thereinto.

An object of the present invention is to provide a method for producing thin films which is capable of forming higher crystallinity thin films compared with those according to the prior art, and an apparatus therefor.

Another object of the present invention is to provide a method for producing thin films which is capable of forming higher crystallinity thin films with less defects in a substrate and the formed films as compared with those according to the prior art, and an apparatus therefor.

The present invention lies in a method for growing films on a substrate by beam deposition, comprising the following steps (I) to (III):

(I) A step for generating ions of elements or compounds thereof to be grown on the substrate;

(II) A step for irradiating the ions produced in the step (I) with electromagnetic waves to excite electronically at least one of said ions;

(III) A step for impacting, i.e., impinging a beam of the ions excited in the step (II) onto the substrate to deposit thereon.

In the present invention, the internal energy (activity) of the ions of elements or compounds to be grown on the substrate is enhanced by irradiating the ions with electromagnetic waves, and subsequently, a beam of the ions is impacted onto the surface of the substrate.

Excitation of the ions with electromagnetic wave irradiation increases the internal energy of the ions so that films having a high crystallinity can be obtained.

The term "high-crystallinity" film means a film hardly containing impurities and crystal lattice defects, if any. The crystallinity can be represented by the full width at half maximum of a diffraction peak of a specific crystal plane.

In the present invention, the ions are impacted onto the substrate before the internal energy is reduced, that is, while they are still in an excited state after they have been excited by irradiating with electromagnetic waves.

The wavelengths of the electromagnetic waves are preferably coincident with those to be absorbed by the excited chemical species produced. Since the light rays to be absorbed depends upon the electron orbits in the chemical species to be excited, and a number of excitation levels exist in one molecule, the wavelengths are selected to excite electrons up to desired excitation levels. Electromagnetic waves to be used include those having predetermined wavelengths selected through a monochromator from light rays generated with a heavy hydrogen lamp, and those from a monochromatic ultraviolet light source such as excimerlaser. Moreover, dye lasers, etc. may also be used because the energies for exciting two-atom and single-atom molecules are relatively small.

Ionization of starting gases containing elements to be deposited on a substrate produces a plurality of ionic chemical species, for example, the ionization of $SiH_4$ producing $SiH_4^+$, $SiH_3^+$, $SiH_2^+$, $SiH^+$, $Si^+$, and the like.

All of the plurality of ionic chemical species, or only specific ions of them may be excited. Selection of the species to be excited depends upon a desired crystal lattice plane, in the direction of which films are grown on the substrate. In order to excite only specific ions, it is necessary to select electromagnetic waves absorbed by the specific ions.

Separation of specific ions from a plurality of ionic chemical species produced by ionization of starting gases, and after exciting with electromagnetic irradiation, impacts of the ions onto the substrate can grow a film in the direction of a selected crystal plane. For this reason, after ionizing the starting gases, it is preferable that specific ions be mass-separated with an electric field, a magnetic field, or a combination of an electric field and a magnetic field. Alternatively, unnecessary ions may be separated out.

Damages of the substrate can be reduced by a process where the ions produced by ionization of the starting gases are neutralized, then excited, and thereafter impacted onto the substrate. In order to achieve the neutralization, for example, the ions are recombined with electrons, or transfer of electric charges between the ions and gaseous molecules is effected.

Thus, impacting electrically neutral particles having the energy required for crystallization onto a substrate allows formation of high-crystallinity thin films without causing damage in the substrate and the thin films.

In the present invention, the ions are in electronically excited states by irradiation with electromagnetic waves in order to preserve the energy required for crystallization.

According to the present invention, when the ions or neutral species in the electronically excited states are impacted onto a substrate, the internal energies thereof are used for the crystallization so that thin films having a higher crystallinity can be grown without heating the substrate at high temperatures.

It is preferable in the present invention that the excitation of the electrons in the ions or neutral particles is performed immediately before they reach the surface of a substrate. In this way, it is possible to prevent the ions or neutral particles in the electronically excited state from falling back to the ground state.

Starting gases to be used preferably consist of selected components to deposit only the predetermined components on the surface of a substrate. When the starting gases contains other substances than requisite components for forming a desired thin film, it is preferable that the gases be ionized and thereafter the ions of the substances not to be deposited on the substrate be separated out.

The separation of only specific ions out of a plurality of ionic components can be performed by a method for mass-separating the specific ions using an electric field and/or magnetic field as described above. Ions to be separated may be those of the components of a thin film, or those of the substances not required for the thin film.

In this way, by separating only the ions of the components for the thin film, the crystallinity can be enhanced and the quality of the desired crystal lattice plane is improved.

For neutralization of ions, i.e., neutralizing them, one may employ a method comprising imparting electrons to the ions, or transferring charges between the ions and inactive gaseous molecules; passing an ion beam through a plasma region to cause collision of the ions with electrons and neutral inactive species resulting in neutralization of the ions; or the like. Naturally, the present invention is not limited to these methods.

The details of the method for imparting electrons to the ions, and the one for transferring charges between the ions and the inactive gaseous molecules as described above can be found in the documents, for example, Masanori Akazaki, "Fundamental Plasma Engineering", (Mar., 1988, published by Sangyo Tosho K.K.) and J. Vac. Technol., 16, (2), 185 (1979).

Although it is the best that all the ions are neutralized in the neutralization step, there is a possibility that a part of the ions remains unneutralized. Therefore, it is preferable that a means for separating the unneutralized particles be provided after the neutralization step.

The separation of the unneutralized particles is desirably performed by deflecting the particles with an electric field or a magnetic field.

Bringing the ions or the neutralized particles into the electronically excited state is desirably effected by irradiating a beam of the particles with electromagnetic waves.

In the context of the description here, the term "neutralization" means making ions electrically neutral. Therefore, neutralized particle is synonymous with neutral particle.

The term "neutral particle" means a particle having no electric charge. Since a flow of the neutral particles does not generate an electric current to be read out, a quantity of the neutral particles is preferably determined by measuring an amount of the heat generated upon impaction of the particles onto a substrate, and converting it into a beam flux of the particles.

Alternatively, a convenient technique for measuring a quantity of the neutral particles comprises using an ammeter, so-called "Faraday cup". This technique will be explained later.

Measurement of the neutral particles in excited states can be effected by measuring wavelengths of the light rays (fluorescence) emitted by the atoms or molecules when they are subjected to the transition from the excited states to the ground state because the wavelengths of the emitted light rays are inherent in the energy gap therebetween in the particles so that the wavelengths are an indication of the excited states of the neutral particles.

The atoms or molecules being in the electronically excited states will be referred to as excited chemical species.

In one of the most preferred embodiments of the present invention, starting gases are ionized, then the produced ions are taken out with an electric field, the velocity of the particles is reduced to a desired energy level (preferably 100 eV or less, more preferably 10 eV or less) with an electric field or a magnetic field, and the decelerated ions are neutralized by recombination with electrons or transferring charges between the ions and gaseous molecules. Unneutralized ions are removed out by deflection with an electric field or a magnetic field before reaching a substrate so that only the neutral particles are impacted onto the substrate. Moreover, the decelerated neutral particles are electronically excited by irradiation with electromagnetic waves immediately before the particles reach the substrate.

In another embodiment of the present invention, starting gases are ionized, then the produced ions are taken out with an electric field, then specific ions are mass-separated with an electric field, a magnetic field, or a combination thereof, and the velocity of the particles is reduced with an electric field or a magnetic field. Thereafter, as in the above-mentioned embodiment, neutralization, electronical excitation and separation of unneutralized ions are performed to supply only specific excited species to the substrate on which a thin film is grown.

Next generation type semiconductor devices, for example, superlattice type devices having a structure of multi-layered crystalline lattice requires a technique of laminating ultra-thin films of different types of semiconductors. They may comprise a combination of a wide variety of thin films, crystallinities of which may vary from perfect crystal to amorphous. Moreover, a technique for forming, or laminating crystals having different grown lattice planes on one surface will be important.

On the other hand, thin-film laminate catalysts are expected to be next generation catalysts having an increased active surface area and an enhanced activity. It has been recognized that an activity of catalyst and a reaction route thereon are different depending upon the direction of the crystal plane of the surface layer of the catalyst. Therefore, techniques for forming thin-film catalysts will require controlling the plane to be grown and the crystallinity.

According to the present invention, a plurality of lines for producing specific excited chemical species can be realized so that the above requirement can be easily achieved.

As inventions using neutral particles, there are those as disclosed in Japanese Patent KOKAI (Laid-open) Nos. Sho 56-28500, Sho 59-196600, Sho 62-238364, Sho 62-60872, and Sho 61-238965. However, none of them brings the neutral particles to the electronically excited state.

As described above, the present invention allows a film having a high crystallinity to be grown without heating a substrate at high temperatures because the internal energy of excited chemical species is consumed for the activation energies required for diffusion thereof on the surface of a substrate, dissociation of impurities, and process of crystallization when the excited chemical species are impacted onto the substrate.

In addition, charge-up of a substrate can be avoided by impacting the electrically neutral particles after excitation onto the substrate. The neutral particles have a lower kinetic energy (10 eV or less) so that little defects are formed in the surface layer of the growing thin film and the substrate. The internal energy of the neutral particles in the electron-excited state varies with the chemical species, but generally in the range of 3 to 5 eV. An activation energy required for crystallization is in the range of 0.1 to 8 eV as described in the literature, J. Appl. Phsy., Vol. 57, No. 11, 1721-1727 (1988). Therefore, the internal energy of the neutral particles in the excited in the present invention is in the range of energy required for crystallization.

When the energy of the particles to be impacted onto the substrate is over a certain level, displacement of crystals may be caused. For example, in case the energy of the particles is in excess of 12.5 eV, Si crystals begin to suffer from surface faults thereof. This energy level causing the displacement varies with crystals, but is said approximately in the range of 20 to 30 eV. Since the kinetic energy of the excited chemical species produced in the present invention is lower than the displacement energy of the crystals (10 eV or less), the surface faults of the growing thin films can be avoided. As described above, the present invention enables the growth of high-crystallinity thin films even at lower substrate temperatures without causing any damages.

Crystalline structures of semiconductor devices and thin film catalyst materials vary with the direction of the grown crystal plane. Recently, developments of techniques for analyzing chemical species in a gas phase, surface conditions, and of theoretical calculation process using a molecular orbital method have been identifying chemical species suitable for crystallization.

For example, it is considered that $SiCl_2$ and $SiH_2$ are suitable as precursors of the species for growing films of silicon single crystal, $SiH_3$ for amorphous silicon, and $CH_3$ for diamond. The present invention enables utilizing selectively such excited chemical species for film growth, and forming greatly higher-crystallinity thin films as compared with conventional techniques. Moreover, the present invention allows the formation of one surface layer containing various areas having different plane directions, or a laminate of a plurality of films different in the direction of crystal plane.

Furthermore, by impacting excited chemical species suitable for crystallization, those suitable for amorphous, or a mixture of both onto a substrate, it is possible to grow a thin film having a desired crystallinity, or to form a laminate of thin films having different crystallinities.

An apparatus for forming a thin film of the present invention comprises an ionization section for ionizing starting gases, and an electromagnetic irradiation section for irradiating the ions with electromagnetic waves in a vacuum system.

Preferably, the apparatus of the present invention further comprises a mass separation section for mass-separating specific ions from others under the action of an electric field and/or a magnetic field disposed after said ionization section. When the mass separation section is disposed after the ionization section, an neutralization section is preferably disposed after the mass separation section. Details of these matters will be explained in Examples later.

EXAMPLE 1

Figure 1:
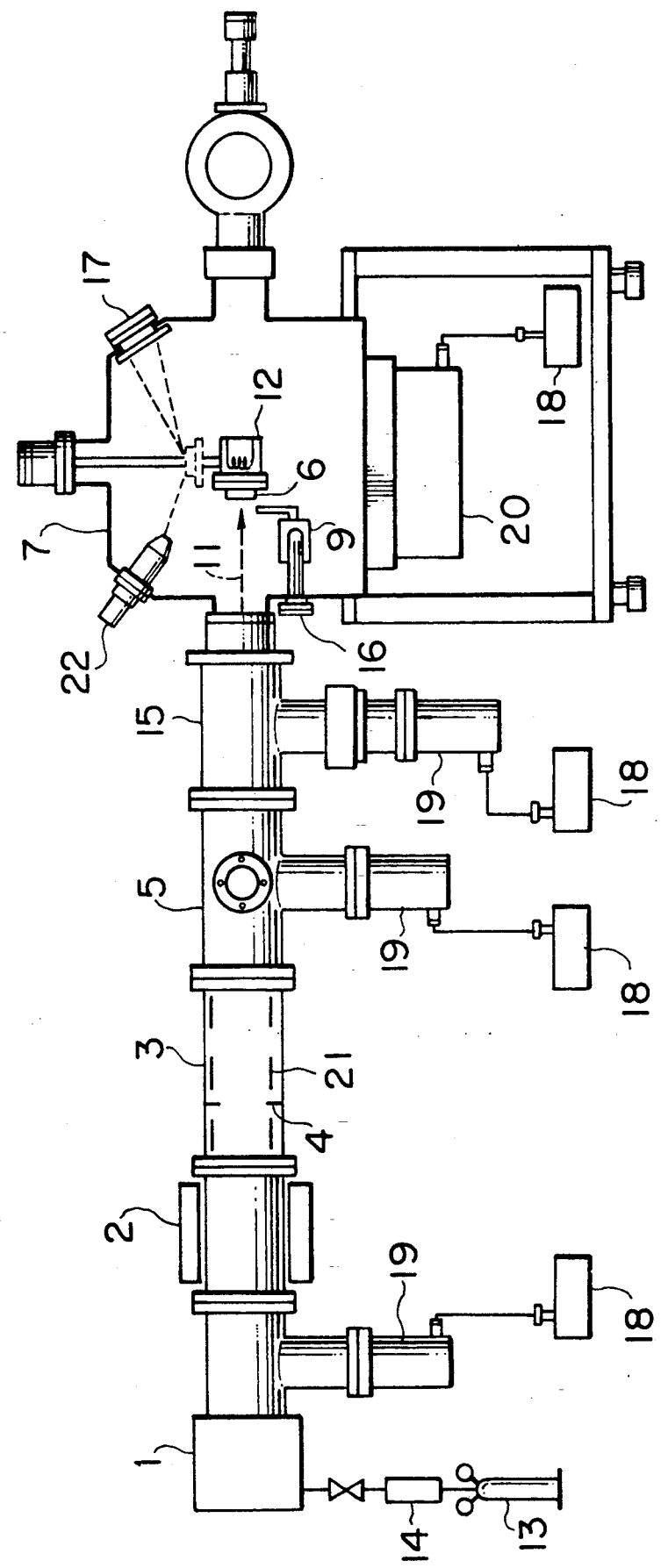
FIG. 1 shows an arrangement of a preferred embodiment of the apparatus according to the present invention.

FIG. 1 shows an illustrative example of the apparatus of the present invention.

Starting gases are supplied from gas reservoir 13 through mass flow controller (MFC) 14 into an ionization section 1 where they are ionized, and then delivered into a mass separation chamber 2 where the ions are mass-separated with an electric field or a magnetic field. Selected ions are decelerated to desired energy levels with decelerating electrodes 4 in a deceleration section 3. Deceleration section 3 has electrostatic lens 21 disposed. The decelerating electrodes have an effect of preventing an ion flux from diverging in combination with the above effect. The decelerated ion flux is delivered into neutralization section 5. Neutralization section 5 has been supplied with inactive gases or analogic gases to the ion flux which bring about exchanging charges with the ions to proceed neutralization thereof. The neutralization section may have a filament for emitting thermoelectrons disposed therein (not shown in FIG. 1) allowing the neutralization by recombination of the ions with the thermoelectrons. Also by disposing a plasma generator, the neutralization of the ions can be effected. Since numerous neutral particles and electrons are present in plasma, passing the ions through the plasma causes easily transfer of charges between the ions and the particles in the plasma resulting in the neutralization of the ions. Unneutralized ions are removed out with ion separator 15. In this way, there is formed a beam comprising specific neutral particles. The beam is introduced into deposition chamber 7 where it is secondary-excited with light source 16 to be in an excited state before it reaches substrate 6. The film grown on substrate 6 is evaluated for crystallinity with RHEED analyzer 17 and electron gun 22. During the production of the ions and the neutral particles as described above, an atmosphere must be maintained under a high vacuum from $10^{-5}$ to $10^{-10}$ torr, which can be realized by evacuating the systems with pumps 18, 19, and 20.

Practical details of the process can be found in the aforementioned document, Masanori Akazaki, "Fundamental Plasma Engineering", (Mar., 1988, published by Sangyo Tosho K.K.).

A convenient method for confirm the neutralization of ions is utilizing an ammeter, so-called "Faraday cup". This method can be performed, for example, as follows:

Referring to FIG. 1, in the present invention, starting gases are ionized in ionization section 1, then mass-separated in mass separation section 2, and the mass selected ions are delivered as they are in the direction toward substrate 6 without effecting neutralization. An ammeter, Faraday cup, has been previously provided at the position of substrate 6. Ions collected in the Faraday cut have electric charges so that the flux of the ions can be detected as an electric current magnitude.

Then, in neutralization chamber 5 as shown in FIG. 1 according to the present invention, operation of neutralizing ions is commenced. As the neutralization of ions proceeds, the magnitude of electric current reduces. When it reaches zero, it can be recognized that all the ions are perfectly neutralized and only neutral particles are delivered. In this case, however, if a part of the electrons for neutralization and free electrons in the vacuum vessel used in neutralization section 5 are attracted by ions, or travel into the Faraday cup, an apparent current magnitude varies causing an error in measurement. Therefore, care must be taken to remove out these electrons.

Unneutralized particles are removed out in ion separation section 15 with an electric field or magnetic field, and only neutral particles are impacted onto substrate 6.

On the other hand, the light rays from light source 16 are rendered monochromatic with wavelength selecting device 9, and then irradiated to neutral particle flux 11. With the irradiation, the neutral particles are excited with an increase of the internal energy of them. Although an electron beam generating device can be disposed instead of the light source to achieve the electronical excitation, the light source was here. A substrate may be heated with heater 12.

Using SiH$_4$ as starting gas, SiH$_2^+$ ions were mass-separated. By floating the Ionizer, the initial potential of the ions was controlled in the range of 10 eV to 30 eV. With a substrate being at ground potential, the kinetic energy of the ions reaching the substrate was controlled in the range of 10 eV to 30 eV. The ions were neutralized by exchanging charges with Ar gas in neutralization section 5. Deposition chamber 8 was evaluated at $10^{-9}$ torr at the time of deposition, and the neutral particles were injected in the form of a flux of $6 \times 10^{13}$ (particles/cm$^2$.sec.), and irradiated with light rays of wavelengths of 5000 to 6000 Å to be in the electronically excited state. A dye laser was used as a light source. A substrate of silicon having a surface of (100) plane, and heated at a temperature of 500° C. A film of silicon was grown on the substrate at a rate of 1100 Å/hr. As a result, it was confirmed that the film was grown to a thickness of about 0.5 μm for 5 hours. Examination of the crystallinity of the grown film revealed that the film had been single-crystallized indicating that single crystals can be grown at very lower temperatures as compared with the conventional thermal CVD method.

As the low velocity neutral particles were used, sputtering phenomenon on the film surface was avoided during deposition, and the problem of charge-up of the substrate was obviated.

Figure 3:
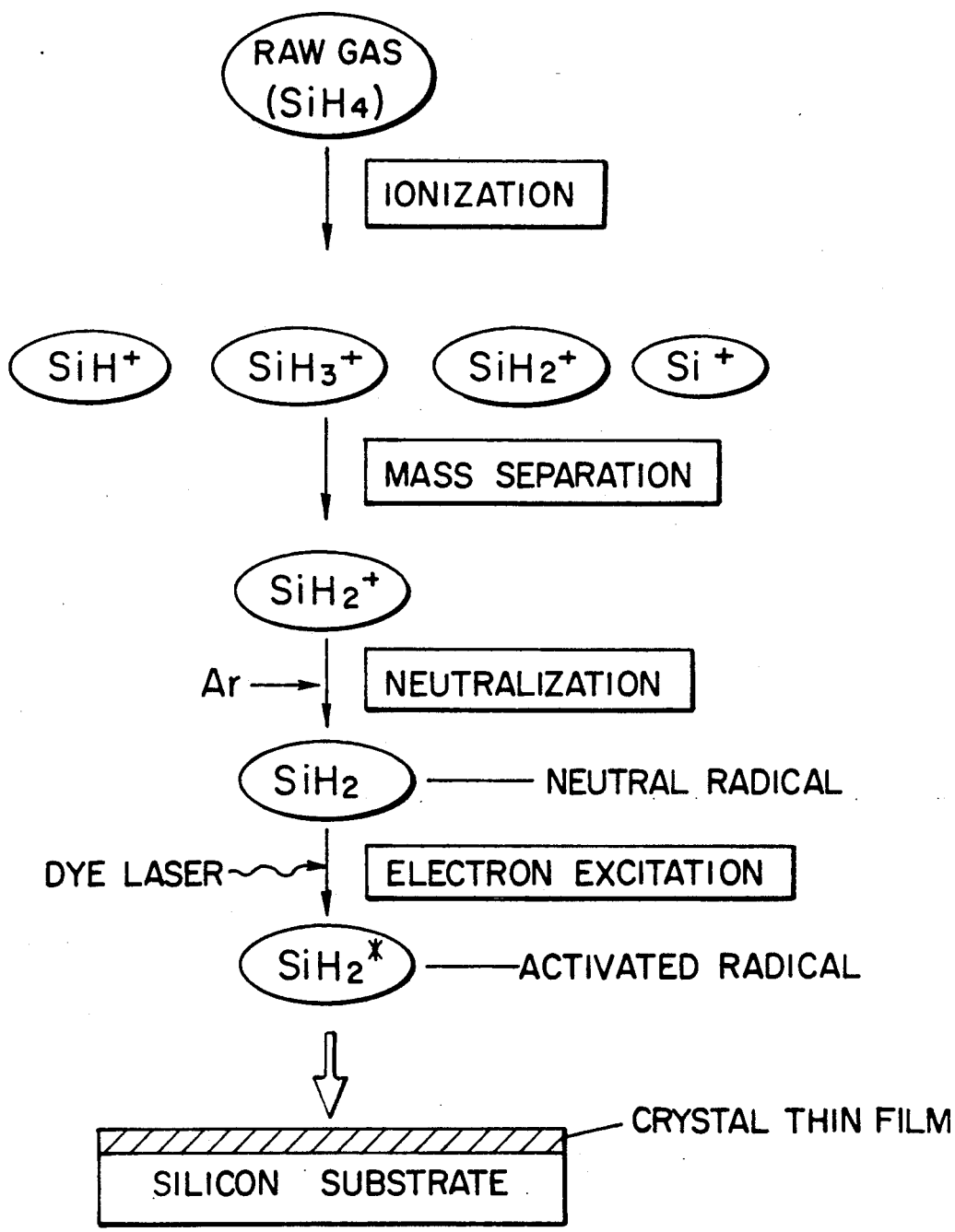
FIG. 3 shows a flowsheet of a preferred embodiment of the method for producing thin films according to the present invention.

FIG. 3 shows schematically a process where starting gases are ionized, brought into the electronically excited state, and reach the silicon substrate. The starting gas molecules, SiH$_4$ are ionized to decompose into a plurality of ionic chemical species. Only SiH$_2^+$ ions are mass-separated from the plurality of ions, and subjected to transfer of charges between the ions and Ar gas to be neutralized resulting in formation of neutral radicals. As under this condition the internal energy of the radicals is at a low level, the radicals are irradiated with the light rays emitted from the dye laser to electronically excite with an increase of the internal energy to produce active radicals. The active radicals are impacted onto the silicon substrate to grow a thin film of silicon single crystal.

EXAMPLE 2

Using an apparatus for experiment as shown in FIG. 1, except that mass-separation section 2 was eliminated, diamond thin films were grown. Methane was used as starting gas, ionized, then neutralized without effecting mass-separation, and then electronically excited. The neutralization and the electronical excitation were performed as in Example 1, except that a heavy hydrogen lamp was employed as light source and the irradiation was effected with ultraviolet rays of 1400 to 2200 Å. A substrate of silicon was used and heated at a temperature of 400° C. The film was grown at a rate of about 0.3 μm/hr. to a thickness of about 1.5 μm for 5 hours. X-ray diffraction analysis indicated that the grown diamond film had a high crystallinity of 0.3 degree or less expressed as the full width of at half maximum of the peak of (111) plane.

EXAMPLE 3

Figure 2:
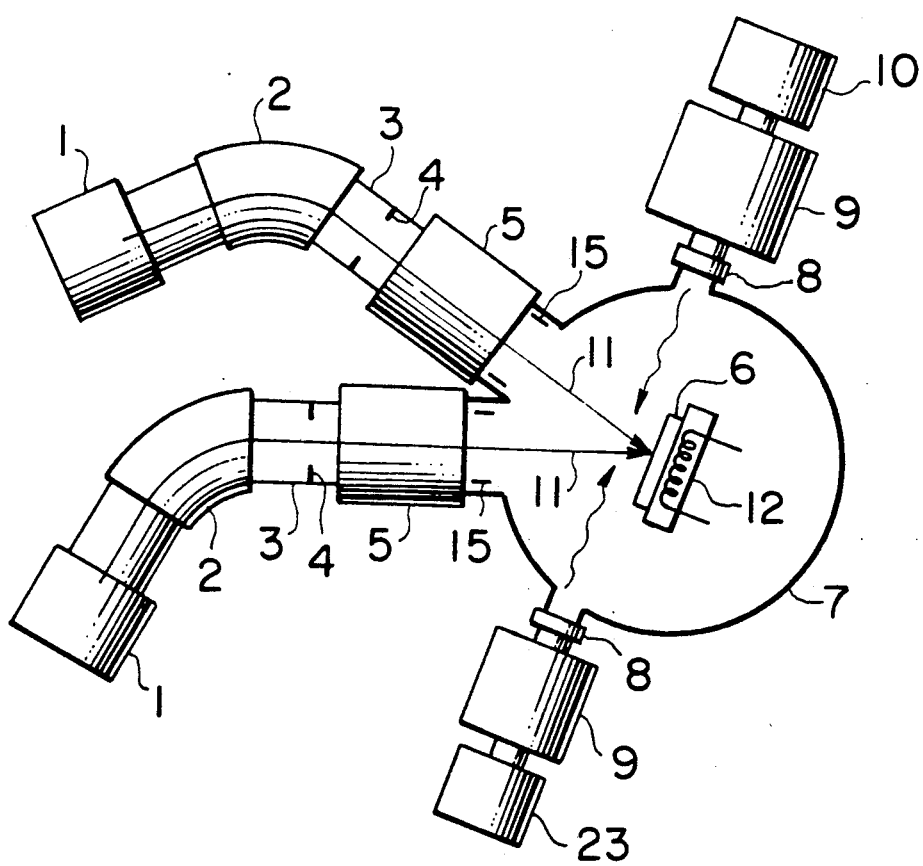
FIG. 2 shows an arrangement of another preferred embodiment of the apparatus according to the present invention.

With reference to FIG. 2, an apparatus operated was similar to that shown in FIG. 1, except that there were two lines for producing desired chemical species with two light sources for electronical excitation being disposed, respectively. Silane was used as starting gases for both lines. $SiH_2$ molecules were produced as excited chemical species for forming single crystal film on one line, while $SiH_3$ molecules were produced for forming amorphous film on the other line. First, $SiH_2$ specifies were impacted, then $SiH_3$ species were impacted onto the substrate, and the cycle was repeated to form a laminate of thin films. The laminate comprises three single crystal layers and three amorphous layers, the total being six layers. Impact of $SiH_2$ species was carried out each time for 20 minutes to grow a thickness of about 300 Å of each layer of single crystal film. Impact of $SiH_2$ species was also carried out each time for 20 minutes to grow a thickness of about 500 Å of each layer of amorphous film. The total thickness of the laminate was about 2400 Å.

A heavy hydrogen lamp 23 was employed as a light source for exciting $SiH_3$ species and the irradiation was effected through window 8 with ultraviolet rays having wavelengths of 1000 to 2000 Å selected by means of wavelength selection device 9. A dye laser 10 was used as a light source for exciting $SiH_2$ species and the irradiation was effected through window 8 with light rays having wavelength of 5000 to 6000 Å selected by means of wavelength selection device 9. Examination of the crystallinity of the grown laminate revealed that it had a laminate structure comprising crystalline thin films and amorphous rich thin films.

As described above, supplying specific excited species enables growing selectively only specific crystal plane, and the use of a plurality of excited species enables controlling crystallinity from crystal state to amorphous one.

EXAMPLE 4

Using an apparatus for experiment as shown in FIG. 1, except that mass-separation section 2 and neutralization section 5 were eliminated, silicon thin films were grown. Silane was used as starting gas, ionized, and then electronically excited without effecting mass-separation. Ionization of silane produces positive ions such as $SiH_4^+$, $SiH_3^+$, $SiH_2^+$, $SiH^{30}$, and $Si^+$ through decomposition. In this Example, these various ions were supplied to the substrate without neutralizing the ions. Among them, $SiH_2^+$ which was expected particularly suitable for silicon growth was brought into an electronically excited state by irradiating a flux of the ions with ultraviolet radiation from a heavy hydrogen lamp used. Thus, the ions became in the very highly electronically excited state. X-ray diffraction analysis of the grown thin film indicated that a high crystallinity silicon was formed at lower temperatures as compared with the case where films were grown without effecting any selection of ions.

EXAMPLE 5

Using an apparatus for experiment as shown in FIG. 1, except that neutralization section 5 was eliminated, silicon thin films were grown. Silane was used as starting gas, ionized, then mass-separated, and electronically excited. Ionization of silane produces positive ions such as $SiH_4^+$, $SiH_3^+$, $SiH_2^+$, $SiH^+$, and $Si^+$ through decomposition as described in Example 4. In this Example, the positive $SiH_2^+$ ions which were expected suitable for silicon growth were mass-separated and impacted onto the substrate. The electronical excitation was accomplished in the same manner as in Example 4. X-ray diffraction analysis and electron diffraction analysis of the grown thin film indicated that a high crystallinity silicon identical to that in Example 4 was formed.

What is claimed is:

1. A method of growing a thin film on a substrate, which comprises the steps of:
   (I) producing ions of an element or a compound from a starting gas substance, said element or said compound being a material of the thin film;
   (II) effecting neutralization of the ions by injecting electrons into the ions or transferring charges of the ions to produce neutral particles;
   (III) electronically exciting said neutral particles with an electromagnetic wave without ionizing said neutral particles; and
   (IV) guiding the excited neutral particles along a path towards a surface of the substrate, whereby the excited neutral particles impinge the surface and deposit thereon to form the thin film.

2. The method according to claim 1, wherein the substrate is made of a metal, ceramic or silicon.

3. The method according to claim 1, wherein the gas substance is $SiH_4$ and the thin film is of silicon.

4. The method according to claim 1, wherein the ions are at least one member selected from the group consisting of $SiH_4^+$, $SiH_3^+$, $SiH_2^+$, $SiH^+$ and $Si^+$.

5. The method according to claim 1, wherein the particles are at least one member selected from the group consisting of $SiH_4$, $SiH_3$, $SiH_2$, $SiH$ and $Si$.

6. The method according to claim 1, wherein the particles are $CH_3$ and the thin film is a diamond film.

7. The method according to claim 1, wherein the particles are $SiCl_2$ and $SiH_2$ and the thin film is a single crystal film of silicon.

8. The method according to claim 1, wherein the particles are $SiH_3$ and the thin film is an amorphous film of silicon.

9. The method according to claim 1, wherein the particles are $SiH_2$ and $SiH_3$ and the thin film is a laminate of a single crystal film of silicon and an amorphous film of silicon.

10. The method according to claim 1, wherein said neutral particles are excited so as to have an internal energy within a range of 3-5 eV.

11. The method according to claim 1, wherein said neutral particles which impinge the surface have a kinetic energy of 10 eV or less.

12. A method of growing a thin film on a substrate, which comprises the steps of:
   (I) producing ions of an element or a compound from a starting gas substance, said element or said compound being a material of the thin film;
   (II) subjecting the ions to mass-separation to separate at least one sort of specific ions;
   (III) effecting neutralization of the specific ions by injecting electrons into the ions or transferring charges of the ions to produce neutral particles;
   (IV) electronically exciting said neutral particles with an electromagnetic wave without ionizing said specific ions; and (V) guiding the excited neutral particles along a path towards a surface of the substrate, whereby the excited neutral particles impinge the surface and deposit thereon to form the thin film.

13. The method according to claim 12, wherein the substrate is made of a metal, ceramic or silicon.

14. The method according to claim 12, wherein the gas substance is $SiH_4$, and the thin film is of silicon/

15. The method according to claim 12, wherein the ions are at least one member selected from the group consisting of $SiH_4^+$, $SiH_3^+$, $SiH_2^+$, $SiH^+$ and $Si^+$.

16. The method according to claim 12, wherein the particles are at least one member selected from the group consisting of $SiH_4$, $SiH_3$, $SiH_2$, $SiH$ and $Si$.

17. The method according to claim 12, wherein the particles are $CH_3$ and the thin film is a diamond film.

18. The method according to claim 12, wherein the particles are $SiCl_2$ and $SiH_2$ and the thin film is a single crystal film of silicon.

19. The method according to claim 12, wherein the particles are $SiH_3$ and the thin film is an amorphous film of silicon.

20. The method according to claim 12, wherein the particles are $SiH_2$ and $SiH_3$ and the thin film is a laminate of a single crystal film of silicon and an amorphous film of silicon.

21. The method according to claim 12, wherein said neutral particles are excited so as to have an internal energy within a range of 3-5 eV.

22. The method according to claim 12, wherein said neutral particles which impinge the surface have a kinetic energy of 10 eV or less.

* * * * *